United States Patent [19]

Wiese

[11] Patent Number: 4,916,807
[45] Date of Patent: Apr. 17, 1990

[54] METHOD AND APPARATUS FOR ASSEMBLING CIRCUITS HAVING SURFACE MOUNTED COMPONENTS

[76] Inventor: Paul H. Wiese, 416 Paddlewheel Ct., Westerville, Ohio 43081

[21] Appl. No.: 293,639

[22] Filed: Jan. 5, 1989

[51] Int. Cl.⁴ .............................................. H05K 3/34
[52] U.S. Cl. ...................................... 29/840; 264/220; 361/386; 361/414
[58] Field of Search ................ 29/846, 840; 174/68.5, 174/52.4; 269/279.13, 272.64, 220, 554; 361/386, 414

[56] References Cited

U.S. PATENT DOCUMENTS

| | | |
|---|---|---|
| 2,981,868 | 4/1961 | Severson .............................. 361/414 |
| 3,335,327 | 8/1967 | Damon et al. . |
| 3,388,464 | 6/1968 | Pretty .................................. 29/846 X |
| 3,516,155 | 6/1970 | Smith . |
| 3,517,438 | 6/1970 | Johnson et al. . |
| 3,658,618 | 4/1972 | Gramann ............................. 156/235 |
| 3,670,396 | 6/1972 | Lindberg . |
| 3,778,323 | 12/1973 | Posner ............................... 264/220 R |
| 3,859,723 | 1/1975 | Hamer et al. ........................... 29/840 |
| 3,868,765 | 3/1975 | Hartleroad et al. . |
| 4,029,999 | 6/1977 | Neumann et al. ................... 361/386 |
| 4,079,509 | 3/1978 | Jackson et al. . |
| 4,373,259 | 2/1983 | Motsch ................................. 29/840 |
| 4,474,639 | 10/1984 | Fritz ..................................... 156/556 |
| 4,489,487 | 12/1984 | Bura ..................................... 29/840 |
| 4,788,767 | 12/1988 | Desai et al. ........................ 29/840 R |

Primary Examiner—Carl J. Arbes
Attorney, Agent, or Firm—Mueller and Smith

[57] ABSTRACT

Surface mounted circuit components having surface mount leads are mounted upon circuit boards having corresponding patterns of surface mount pads by a procedure wherein a male mold is made by positioning mold defining circuit components upon a transparent spacer which, in turn, is positioned over a circuit board or the equivalent. The transparent spacer is provided having vacuum transmission openings in it and the assemblage is positioned within vacuum forming apparatus to provide a transparent female mold. An arrangement for locating alignment pins may also be developed for the female mold. The female molds are mounted upon a universal back board along with alignment pins and production circuit components are inserted therein. Production circuit boards then are positioned over the female molds and inserted circuit components along with an adhesive for use in subsequent flow soldering connections, or a Re-Flow solder for that form of lead connection. A retainer is positioned over the assembled circuit board and the assemblage is inverted to expose the assembled circuit boards for Re-Flow or wave soldering processing.

16 Claims, 5 Drawing Sheets

U.S. Patent   Apr. 17, 1990   Sheet 1 of 5   4,916,807
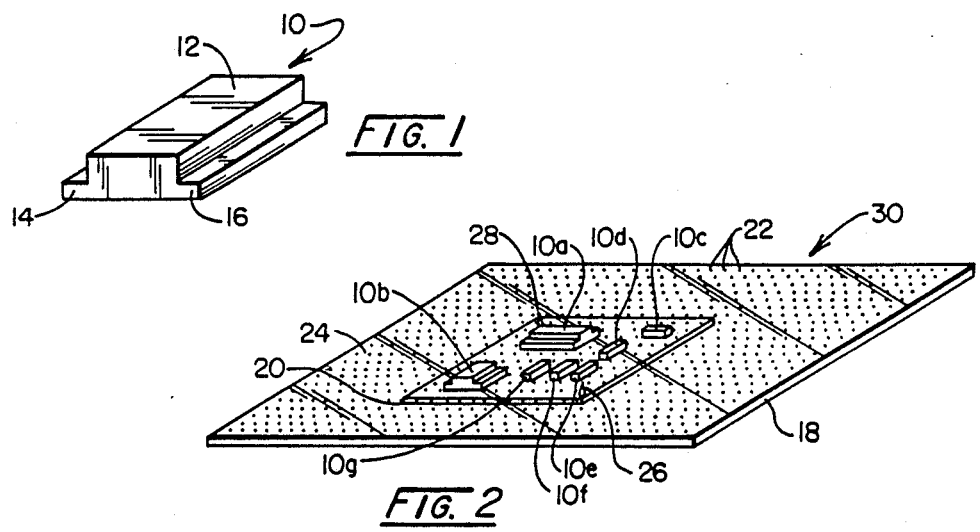
FIG. 1
FIG. 2
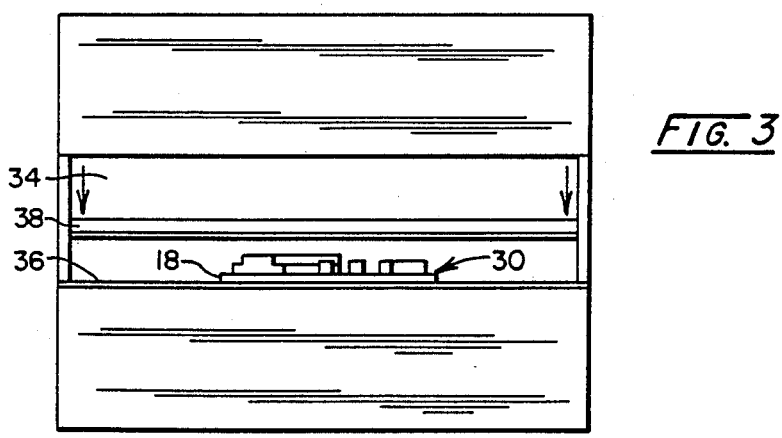
FIG. 3
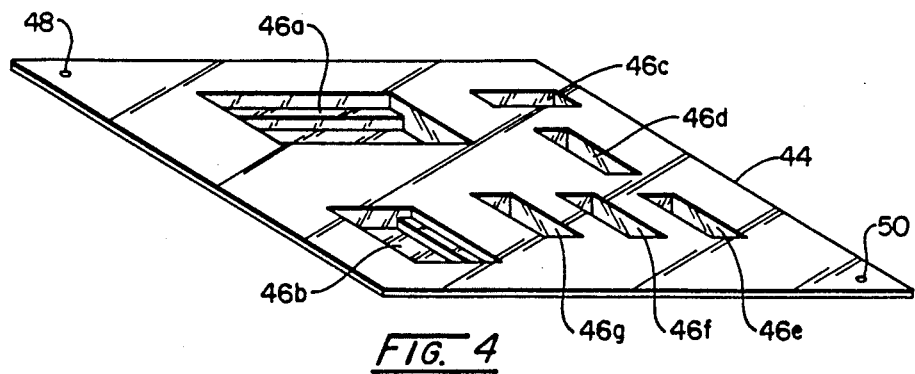
FIG. 4

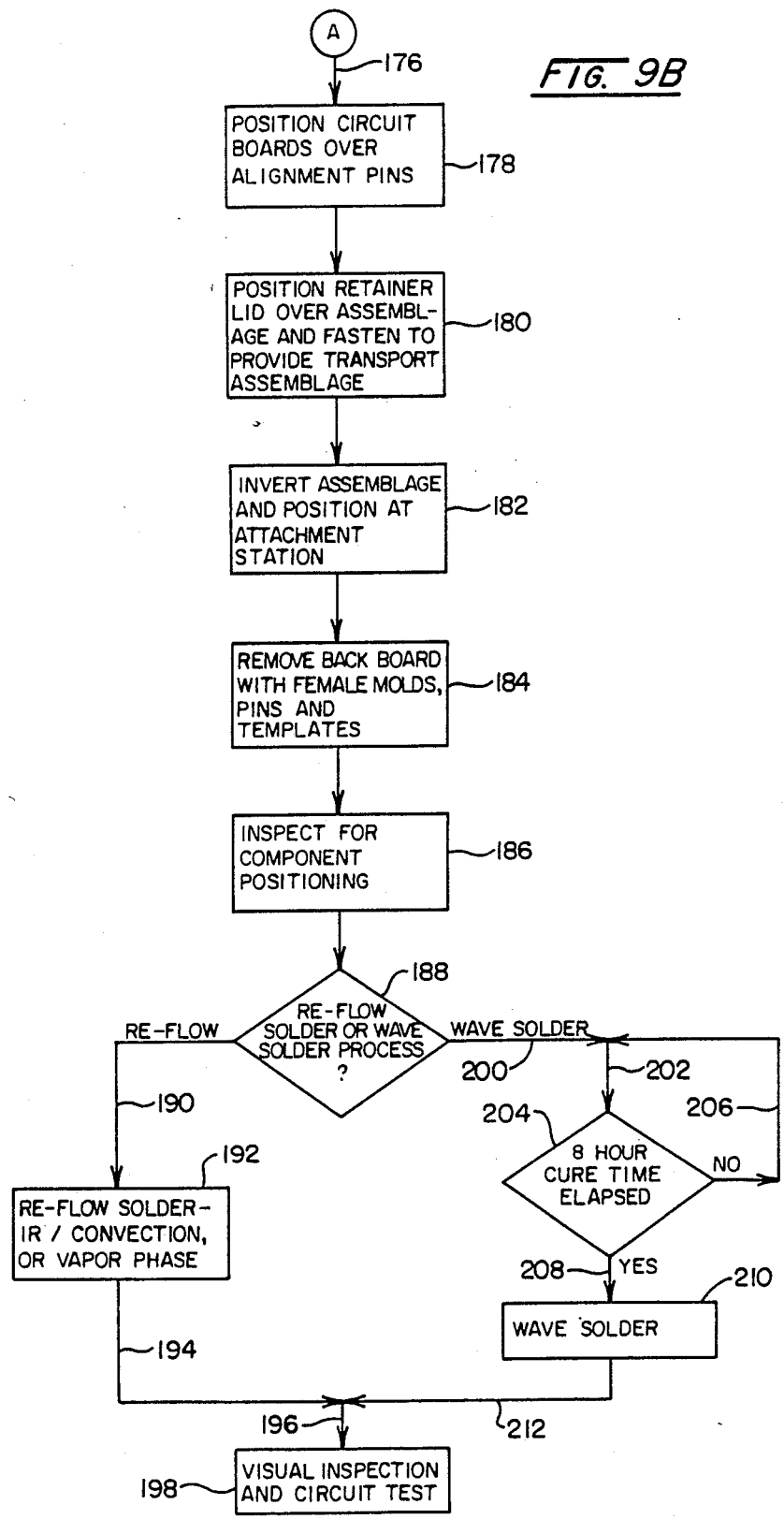

METHOD AND APPARATUS FOR ASSEMBLING CIRCUITS HAVING SURFACE MOUNTED COMPONENTS

BACKGROUND OF THE INVENTION

The assembly of electronic components into functional circuits is carried out utilizing a broad variety of techniques, ranging from the hand positioning and soldering of components to a substrate such as a circuit board to the employment of automated, robotic assembly systems. While the latter automated systems may be highly efficient, such efficiency is realized only under very high volume production circumstances. Where unit volumes are lower, for example below batch unit numbers of about 10,000 circuit board units, practical production criteria generally dictates a return to semi-automatic or hand-assembly approaches.

Over the recent past, surface mounted circuit technology has been introduced. With this technology, component leads are not inserted through receiving holes formed within a circuit board or like substrate, but are fashioned to extend outwardly in parallel with the supporting circuit board surface. Correspondingly, the printed circuits supported by the circuit board are configured having sequences or patterns of surface mounting pads configured to mate in abutting contact with the short, outwardly-extending surface mount leads of the components.

Where production volumes dictate the use of hand assembly techniques for the surface mounted systems, numerous manipular complexities are imposed upon assembly personnel. Initially, the minutely-dimensioned surface mount leads must be aligned by eye with corresponding substrate pad patterns. Such alignment must be quite exacting. Following placement, the components must be physically retained in position, inasmuch as only a freely-abutting lead-pad association is developed. Typically, the component is glued to the circuit board at the time of placement and alignment. Following the gluing procedure, a circuit completing lead-pad union is formed utilizing wave-soldering or similar technology. Alternately, Re-Flow techniques may be employed wherein a Re-Flow solder is deposited upon the pads of the printed circuit board and the assembly of circuit board and circuit components is submitted to IR/convection, or vapor phase type connecting procedures. Because component leads are not inserted through circuit board receiving holes, the assurances or operator feedback that a proper component has been positioned at a correspondingly proper location within a forward mounted circuit often are not present with surface mount systems. In view of the foregoing, investigators have sought to develop a technique for providing practical, relatively lower volume assembly approaches for surface mounted type circuits wherein proper component selection and pad-lead alignment are assured and the otherwise intense labor requirements for assembling these systems are returned to more reasonable levels.

SUMMARY

The present invention is addressed to a method and associated apparatus for assembling surface mounted circuit components upon circuit boards or similar supportive substrates which achieve proper alignment between components leads and substrate pads. Ideally suited for hand assembly batch manufacturing procedures, accuracy of circuit formation is realized with the method while a substantial reduction in the intensity of labor otherwise required for such procedure is achieved. The technique of the invention may employ either Re-Flow solder or wave solder procedures for final connecting procedures.

A feature of the invention is to provide a method for assembling circuits formed of supportive circuit substrates carrying circuit configurations having surface mount pads of predetermined pattern located on the surface thereof for abutting connecting with circuit component surface mount leads of corresponding mating patterns. The method includes the following steps:

providing a transparent spacer having a flat, upwardly-disposed surface;

positioning the spacer over a mold defining circuit substrate;

positioning mold defining components upon the spacer flat surface in lead matable alignment with corresponding surface mount pad patterns to provide a male mold;

forming a polymeric female mold from the male mold;

inserting circuit components corresponding with the mold defining components within the female mold;

positioning a production circuit substrate upon the female mold over the inserted circuit component; and substantially simultaneously electrically coupling the surface mount leads of the inserted circuit components with corresponding surface mount pads of the production circuit substrate.

Another feature of the invention provides a method for assembling circuits formed of supportive circuit boards carrying circuit configurations having surface mount pads of predetermined pattern located on the surface thereof for abutting connection with circuit component surface mount leads of corresponding mating pattern, comprising the steps of:

providing a male mold of mold defining components arranged in correspondence with the circuit board surface mount pad pattern;

forming a polymeric female mold from the male mold;

providing a supportive assembly backboard having a forwardly disposed receiving surface;

positioning the female mold upon the backboard receiving surface;

inserting circuit components corresponding with the mold defining components within the female mold;

positioning a production circuit board upon the female mold over the inserted circuit component;

positioning a retainer lid over the positioned production circuit board and receiving surface to provide a retained circuit assemblage;

inverting the retained circuit assembly;

removing the supportive assembly backboard and female mold to expose the production circuit board and inserted circuit components; and substantially simultaneously electrically coupling the surface mount leads of the inserted circuit components with corresponding abutting surface mount pads of the production circuit board.

Other objects of the invention will, in part, be obvious and will, in part, appear hereinafter.

The invention, accordingly, comprises the method and apparatus possessing the arrangement of parts and steps which are exemplified in the following detailed disclosure. For a fuller understanding of the nature and objects of the invention, reference should be had to the following detailed description taken in connection with the accompanying drawings.

BRIEF DESCRIPTION OF THE DRAWINGS

FIG. 1 is a perspective view of a mold defining component as employed with the method of the invention;

FIG. 2 is a perspective view showing a step in the method of the invention wherein mold defining components as represented at FIG. 1 are positioned over the flat surface of a transparent spacer;

FIG. 3 is a front elevational view showing the male mold assemblage of FIG. 2 positioned within a vacuum molding apparatus;

FIG. 4 is a perspective view of a female mold produed by the apparatus of FIG. 3;

FIGS. 9A and 9B combine to provide a flow chart describing the method of the invention.

DETAILED DESCRIPTION OF THE INVENTION

Figure 5:
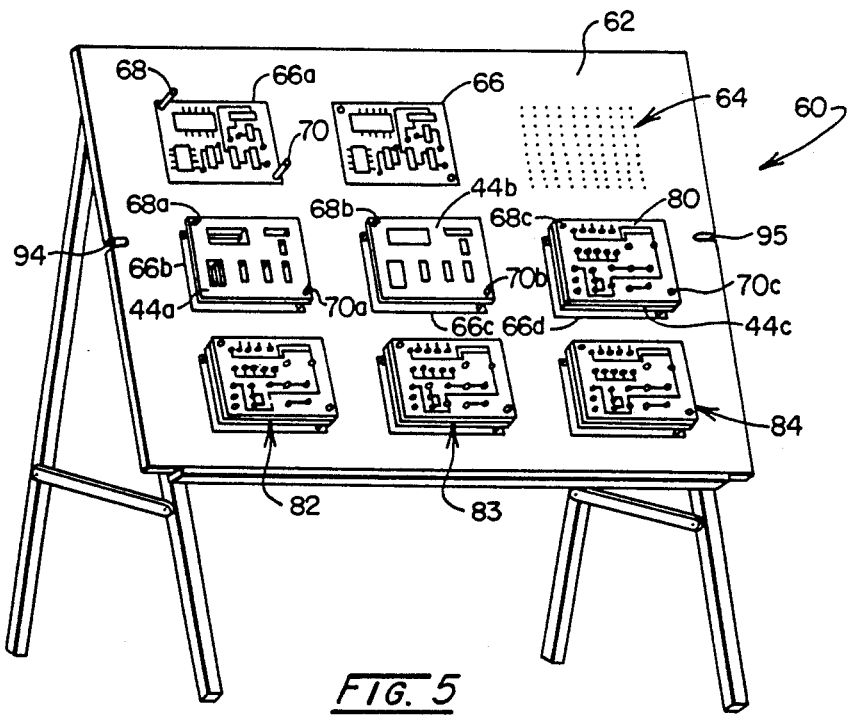
FIG. 5 is a perspective view showing a supportive assembly back board having a receiving surface carrying female molds and related assemblages according to the method of the invention.

The technique of the invention is one achieving a highly desirable registration of the surface mount leads of circuit components with corresponding circuit pad patterns on a circuit board or substrate through the use of relatively simply produced vacuum formed female molds. To form the ultimate female molds, a male mold is developed which is essentially formed from a circuit board carrying a circuit pattern or configuration and associated circuit components. However, to facilitate the removal of male mold components as well as improved insertability of circuit components in the course of the process of the invention, mold defining components are developed for generating the initial male mold. These components, in effect, are stand-in components having dimensions slightly enlarged over the corresponding dimensions of the actual surface mount circuit components otherwise positioned at the circuit board locations. The amount of enlargement of the dimensions are selected as being sufficient to enhance the removal of circuit components from resultant female molds in the production procedure while maintaining necessary alignment of inserted components with the circuit boards. Additionally, for example, where Re-Flow soldering techniques are to be employed, enlargement of the surface mount lead regions of the stand-in device may be effected to permit room for soldering materials.

Looking to FIG. 1, a mold defining component as above described is represented generally at 10. Component 10 is of a stand-in variety as opposed to be an actual circuit component itself and is seen to include a main body portion 12 along with outrigger type extensions as at 14 and 16 providing a mold region accommodating surface mount leads. Enlargement of dimensions with respect to the actual or production circuit components is in the lengthwise and widthwise sense, the height of the stand-in device remaining equivalent to the circuit component mimicked by it. The dimensions of the mold defining component 10 preferably are enlarged by about one to four percent. The mold defining components 10 may, for example, be formed of plastic by inexpensive procedures such as injection molding and are provided for each discrete component which may be employed within a given circuit. Alternately, the actual circuit components themselves may be utilized but without the advantage of achieving mold relief found desirable with the process.

Referring to FIG. 2, the mold components as at 10 are employed with a transparent spacer 18 which is positioned directly over a circuit board revealed at 20. Utilized to develop a male mold, the spacer 18 is configured having a plurality of vacuum transmmission openings as at 22 which extend therethrough to an upwardly-disposed flat surface 24. Because the spacer 18 is transparent, the pattern of the circuit leads and surface mount pads may be observed by the operator. Accordingly, mold defining components as at 10 and herein represented at 10a-10g are located over appropriate positions upon the circuit board 20 such that the surface mount leads or lead regions thereof mate appropriately with the surface mount pad patterns of the circuit board 20. Of course, a graphic representation of the circuit may be used in lieu of an actual circuit board as at 20. Alignment or registering pins 26 and 28 may be located to extend upwardly from spacer 18 to establish alignment or registering locations for later alignment use. The mold defininng components 10a-10g preferably then are attached to the upwardly-disposed surface of spacer 18 by a suitable adhesive such as an epoxy. Upon the securing of components 10A-10g to the spacer 18, the entire assemblage, now represented at 30, is a male mold from which a corresponding female mold is produced by vacuum forming.

Referring to FIG. 3, a vacuum forming apparatus is represented generally at 32. Apparatus 32 is of conventional configuration and includes a molding chamber 34 having a perforated vacuum defining surface 36 and a molding frame implement 38 which carries a pre-mold thermoplastic sheet material and is manually drawn inwardly over the male mold to be utilized. In the present application, male mold assemblage 30 is positioned upon the perforated vacuum defining surface 36 and the vacuum transmission openings 22 of the spacer 18 serve to communicate the vacuum of the apparatus 32 upwardly into the environment of the spacer 18, thus to draw the sheet of thermoplastic down over the male mold in intimate adjacency. To enhance registration between the resultant female mold and an associated production circuit board, at least two alignment pins may be employed extending through the substrate 18 from pre-selected positions upon the underlying circuit board 20 represented in FIG. 2.

Referring to FIG. 4, a female mold developed from apparatus 32 as shown in FIG. 3 is illustrated in general at 44. Note that the mold includes component receiving recesses 46a-46g corresponding with the mold defining components 10a-10g described in conjunction with FIG. 2. Additionally shown in FIG. 4 are two alignment locations 48 and 50 which may be formed by the earlier-noted alignment pins. Locations 48 and 50 provide registration indicia for later assembly procedures. Following the production of the female mold 44, it is trimmed and inspected and the procedure is reiterated to the extent required for a given batch assembly procedure.

Referring to FIG. 5, the assembly procedure is illustrated as commencing in conjunction with a supportive assembly represented generally at 60 including a universal backboard 62 which preferably will be formed having a plurality of alignment pin receiving apertures shown as an array thereof in general at 64. Initially positioned over the array 64 for each assembly station is an assembly template represented at 66. Template 66 will provide identifications of the circuit components to be inserted at a particular location within the female mold 44. While optional, the template 66 serves to improve the yield rate of the manufacturing process in many instances. As a next step in the set-up of the manufacturing procedure, alignment pins are inserted into appropriate apertures 64 at the location of the registration indicia 46 as may be identified on template 66. Two such alignment pins are shown in FIG. 5 at 68 and 70 positioned at appropriate locations identified by an assembly template now represented at 66a. Next in the procedure, a female mold as at 44 and now represented at 44a is positioned over the template as represented at 66b in an alignment therewith established by alignment pins now represented at 68 and 70a. Circuit components are then inserted within the component receiving recesses described in conjunction with FIG. 4 at 46a–46g. An assemblage including the thus-inserted circuit components is represented by female mold 44b which is positioned over template 66c and aligned by alignment pins 68b and 70b. As a next step in the procedure, a production circuit board is positioned over the female mold with inserted circuit components and in alignment with the alignment pins. Prior to positioning the circuit board or substrate, a treatment thereof depending upon the type of attachment of surface mount leads with circuit pads is carried out. Where flow soldering techniques are contemplated, then an adhesive is deposited upon the production circuit boards prior to positioning over the components such that the components will adhere thereto. On the other hand, where a Re-Flow soldering technique is to be undertaken, then Re-Flow solder is deposited upon the circuit boards at the pad pattern locations. FIG. 5 shows the positioning of a circuit board 80 in appropriate alignment defined by alignment pins 68c and 70c so as to be positioned over a female mold carrying production circuit components as represented at 44c as well as over an underlying assemblage template 66d. Each position upon the universal back board 62 thus is assembled, such completed assemblages being shown in FIG. 5 at 82–84.

Figure 6:
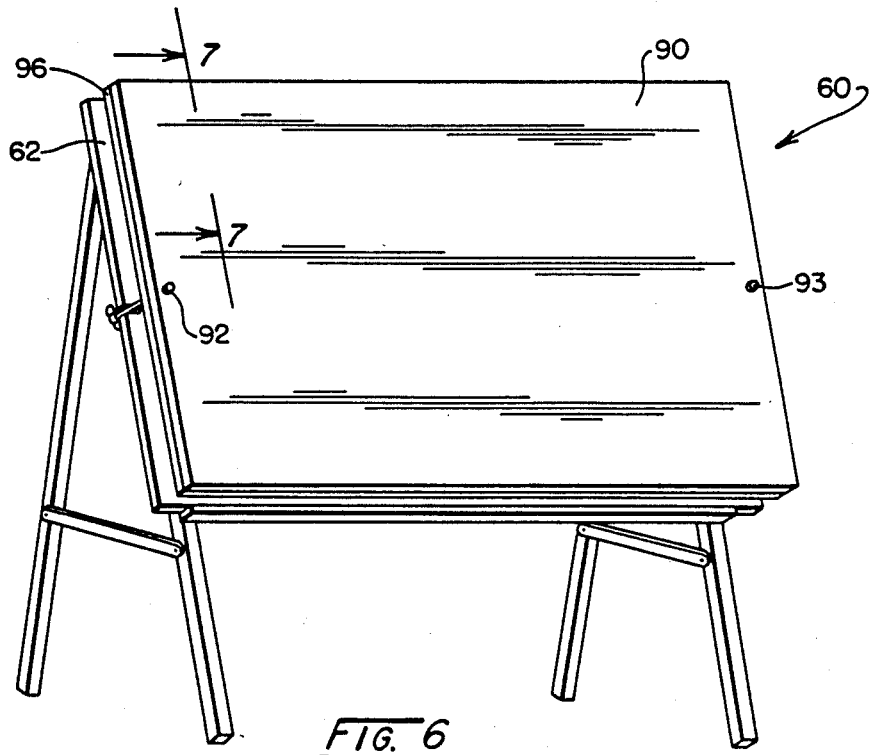
FIG. 6 is a perspective view showing the supportive assembly back board of FIG. 5 having a retainer lid positioned thereover.

Turning to FIG. 6, upon the completion of procedures involving the locating of female molds upon the universal back board 62 and carrying out all assemblies at the face thereof culminating in the positioning of production circuit boards thereover with appropriate connective material such as an adhesive for flow soldering or a Re-Flow solder for that form of process, then, a retainer lid 90 is positioned over the entire assemblage and fixed thereto. In this regard, two bolt and wing nut assemblages are shown for the connecting purpose at 92 and 93. These bolt and wing nut assemblages 92 and 93 are employed in conjunction with laterally disposed slots shown in FIG. 5 respectively at 94 and 95 formed within the universal back board 62. Of course, other coupling techniques are available. For example, male-female aligning cylinders or tubes may be installed at the four corners of the assemblage to improve the removable connection of board 62 and retainer lid 90. A quite simple retainer then may be employed in place of bolt and wing nut assemblages 92 and 93.

Preferably, the retainer lid 90 is configured having a pliant inwardly disposed surface 96 which provides for retention of the circuit board assemblages within the resultant sandwich structure while avoiding any harm thereto. A foamaceous polymer or foam rubber may be employed for this purpose.

Figure 7:
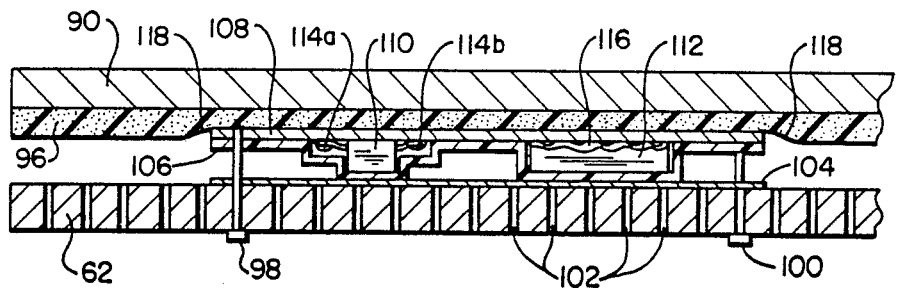
FIG. 7 is a partial sectional view taken through the plane 7—7 of FIG. 6.

Referring to FIG. 7, a sectional representation of the thus-retained circuit board, circuit-component female mold assemblages is revealed. In the figure, two alignment pins are revealed at 98 and 100 which have been inserted through two holes of the array of alignment pin holes or apertures, certain of which are revealed at 102. Pins 98 and 100 are seen to extend through an alignment template 104 thence through a female mold 106 and into a production circuit board 108. Production circuit components as at 110 and 112 are seen positioned within female mold 106 and the surface mount leads thereof are shown carrying deposits of reflow solder respectively at 114a–114b and 116. Note that the pliant inwardly-disposed surface 96 is slightly depressed as at 118 to show the compressive retention of the entire assembly.

Figure 8:
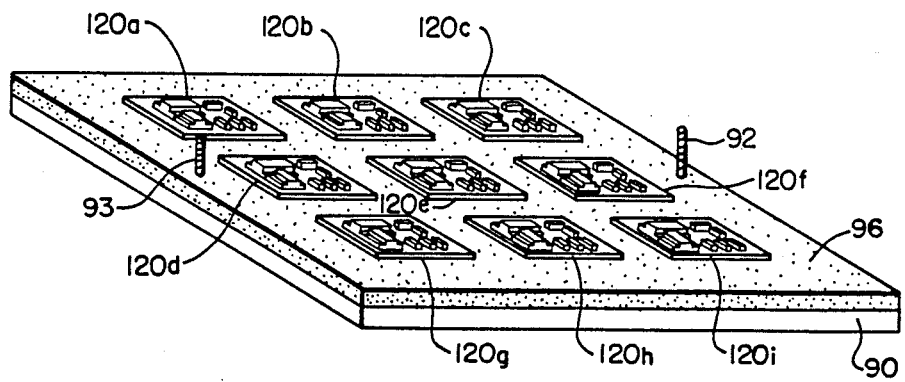
FIG. 8 is a perspective view of the assemblage of FIG. 6 having been inverted and wherein the supportive assembly back board and female molds thereof have been removed to expose production circuit boards.

As a next step in the production procedure, the assemblage including universal back board 62 and retainer lid 90 is inverted and the universal back board 62 is removed from its connection with bolt and wing nut assemblages 92 and 93. The result is revealed in FIG. 8 wherein an array of circuit boards as at 120a–120i are seen to be supported upon the surface 96 of retainer lid 90 in an upward orientation for submittal to a Re-Flow soldering process, for example which may be carried out by IR/convection or vapor phase procedures. Where a flow soldering attachment technique is contemplated, then the circuit components will be adhesively affixed to an adjoining production circuit board. For either approach, a substantially simultaneous electrical coupling of the surface mount leads of the inserted circuit components with the correspondingly abutting surface mount pads of each circuit board is carried out.

Figure 9A:
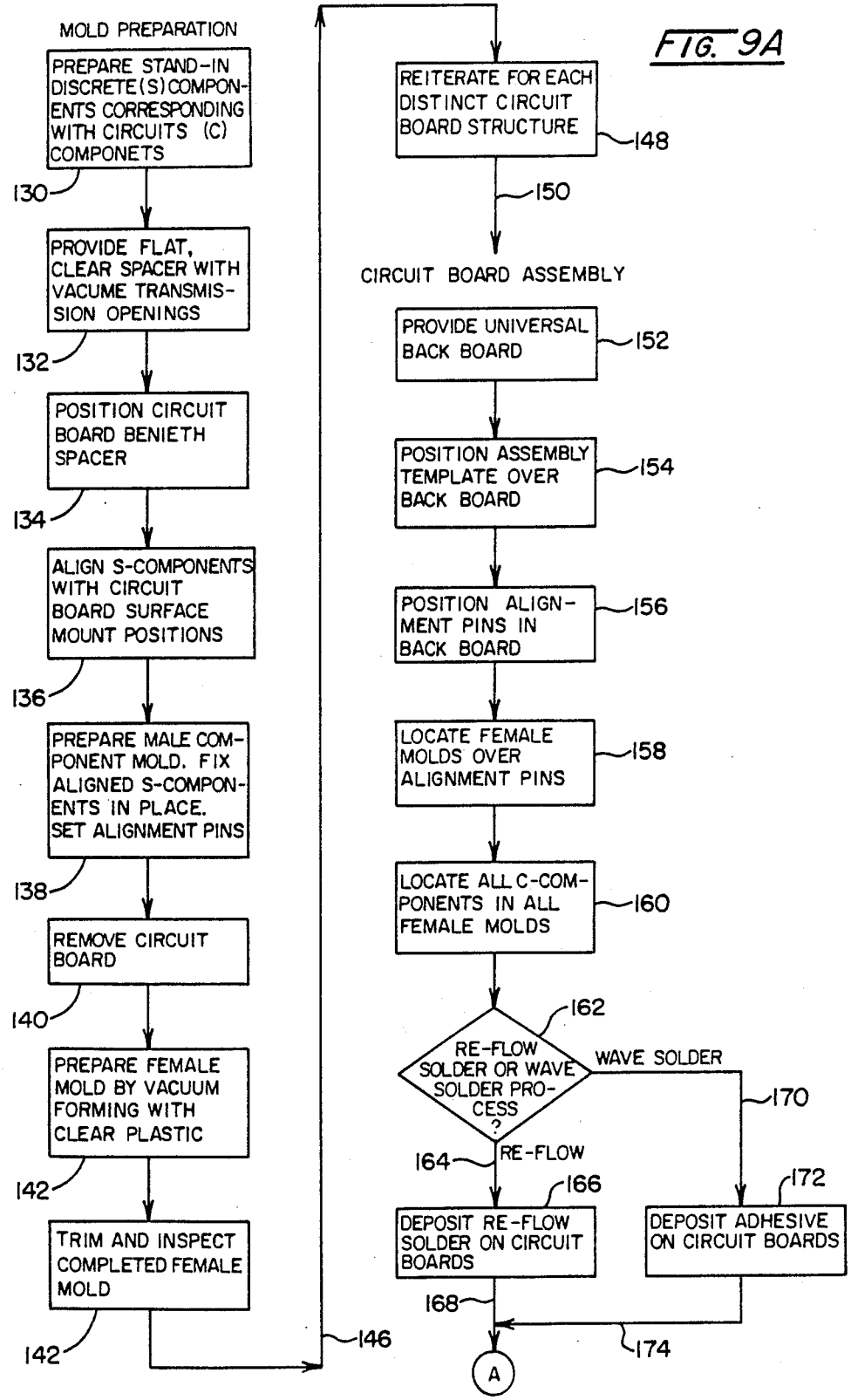

Turning to FIG. 9A, the fabrication procedure as heretofore described is illustrated in flow chart fashion. The initial procedures involve mold preparation as labeled and the initial step in the process is represented at block 130 describing that stand-in discrete components corresponding with circuit components are prepared. These components, for example, have been described in conjunction with FIG. 1 at 10. As noted above, while actual circuit components can be used for this purpose, to achieve improved insertion and removal of circuit components from the resulting female mold, slightly larger stand-in components are desired for this mold defining component function. The process then continues as represented at block 132 wherein a flat, clear spacer component with vacuum transmission openings formed therein is provided. This is the spacer as represented at 18 in FIG. 2 along with the openings passing therethrough as represented at 22 in that figure. A circuit board or the equivalent is then positioned beneath the noted transparent spacer as represented at block 134, and as represented at block 136, the stand-in or "S" components are aligned with the circuit board surface mount positions as discussed in conjunction with the positioning, for example, of components 10a–10g described in connection with FIG. 2. These stand-in components may be adhesively fixed in place as described at block 138 in conjunction with the preparation of the male component mold. Additionally as part of this preparation, alignment pins may be set. The process then continues as represented at block 140 wherein the underlying circuit board or equivalent is removed and, as represented at block 142, a female mold is prepared by a vacuum forming, conventional clear thermoplastic sheet polymer being utilized. As represented at block 144, the resultant female mold then is trimmed and inspected and, as represented by line 146 and block 148, the mold preparation procedure is reiterated for the number of assembly stations to be provided at a universal back board.

As represented at line 150, the fabrication procedure then looks to circuit board assembly employing the thus-developed female molds. The assembly commences as represeted at block 152 with the provision of a universal back board as represented at 62 in conjunction with the assembly 60 in FIG. 5. Then, as represented at block 154, where desired, an assembly template may be positioned over the universal back board as described at 66 in the latter figure. The procedure then provides for the positioning of alignment pins within the universal back board as represented at block 156 and as shown at block 158, the female molds then are located over these positioned alignment pins. As represented at block 160, the procedure then provides for locating all circuit components, i.e. production circuit components within the component receiving recesses of the female molds.

The next steps in the procedure are predicated upon the form of simultaneous connection to be provided between the surface mount leads and corresponding circuit board pads. In this regard, a determination is made as to whether, for example, a Re-Flow solder process or a wave solder process is to be employed. Where a Re-Flow process is to be employed, then as represented at line 164 and block 166, Re-Flow solder is deposited on the circuit boards at the pad locations. The process then continues as represented at line 168.

Where a wave solder process is contemplated, then as represented at line 170 and block 172, adhesive is deposited on the circuit boards at a location for securing the production circuit components thereto. The process then proceeds as represented at lines 174 and 168 to node A which is seen to continue at FIG. 9B and line 176. Block 178 of that figure indicates that the next step is the positioning of production circuit boards over the alignment pins positioned upon the universal back board. Then, as represented at block 180, reatiner lid 90 is positioned over the assemblage of circuit board and is fastened upon the universal back board. As represented at block 182, the sandwich-type assemblage then is inverted and as represented at block 184, the back board with female molds, pins, and templates is removed to provide the arrangement illustrated as exemplary in FIG. 8. The circuits so revealed then are inspected for component positioning and the like as represented at block 186 and the ensuring process steps are determined depending upon whether a Re-Flow solder or wave solder process is to be used for the purpose of effecting substantially simultaneous electrical coupling between the surface mount leads of the production circuit components corresponding abutting surface mount pads of the production circuit boards. Where a Re-Flow approach is elected, then as represented at line 190 and block 192, Re-Flow soldering procedures are undertaken either, for example, by IR/convection procedures or by vapor phase procedures and the process continues as represented at lines 194 and 196 to the final step of visual inspection and circuit testing as represented at block 198.

Where wave solder connective procedures are employed, then as represented at lines 200, 202, and 204, a determination is made as to whether an adequate period of time for curing of the adhesive attaching circuit boards to production circuit components has elapsed. For example, an eight hour curing epoxy adhesive may be used for this purpose. Where that time interval has not elapsed, then as represented by line 206, the process is delayed for an adequate additional time period. Where a curing time of sufficient interval has elapsed, then as represented at line 208 and block 210, wave soldering procedures are carried out and the process continues as represented by lines 212 and 196 to the final step of visual inspection and circuit testing as represented at block 198.

Since certain changes may be made in the above-described method and apparatus without departing from the scope of the invention herein involved, it is intended that all matter contained in the description hereof or shown in the accompanying drawings shall be interpreted as illustrative and not in a limiting sense.

I claim:

1. The method for assembling circuits formed of supporting circuit substrates carrying circuit configurations having surface mount pads of predetermined pattern located on a surface thereof for abutting connection with circuit component surface mount leads of corresponding mating pattern, comprising the steps of:
   providing a transparent spacer having a flat upwardly disposed surface;
   positioning said spacer over a mold defining said substrate;
   positioning mold defining components upon said spacer flat surface in lead matable alignment with corresponding said surface mount pad patterns to provide a male mold;
   forming a polymeric female mold from said male mold;
   inserting circuit components corresponding with said mold defining components within said female mold;
   positioning a circuit substrate upon said female mold over said inserted circuit components; and
   substantially simultaneously electrically coupling the surface mount leads of said inserted circuit components with corresponding said surface mount pads of said circuit substrate.

2. The method of claim 1 in which:
   said transparent spacer incorporates vacuum transmission openings; and
   said female mold is vacuum formed.

3. The method of claim 1 in which said mold defining component are stand-in components having dimensions selectively enlarged over the corresponding dimensions of said surface mount circuit components sufficient to enhance their removal from said female mold while maintaining the alignment of said inserted circuit components with said positioned circuit board.

4. The method of claim 1 including the steps of:
   providing at least two alignment pins extending from predetermined positions on said substrate through said transparent spacer to derive corresponding alignment locations with said female mold; and positioning alignment pins intermediate said circuit substrate and said female mold at respective said predetermined positions and alignment locations to effect alignment therebetween.

5. The method of claim 1 including the step of adhesively affixing said mold defining components to said spacer flat surface.

6. The method of claim 1 including the step of adhesive connecting said circuit substrate with said inserted circuit components by applying adhesive at select locations of said circuit substrate prior to the said positioning thereof over said inserted components.

7. The method of claim 6 in which said coupling of said surface mount leads with said surface mount pads is by wave soldering.

8. The method of claim 1 including the step of depositing Re-Flow solder upon said surface mount pads of said circuit substrates prior to the positioning thereof over said inserted circuit components.

9. The method of claim 8 in which said coupling of said surface mount leads with said surface mount pads is by re-flow soldering technique.

10. The method for assembling circuits formed of supportive circuit boards carrying circuit configurations having surface mount pads of predetermined pattern located on a surface thereof for abutting connection with circuit component surface mount leads of corresponding mating pattern, comprising the steps of:

providing a male mold of mold defining components arranged in correspondence with said circuit board surface mount pad patterns;

forming a polymeric female mold from said male mold;

providing a supportive assembly back board having a forwardly disposed receiving surface;

positioning said female mold upon said back board receiving surface;

inserting circuit components corresponding with said mold defining components within said female mold;

positioning a circuit board upon said female mold over said inserted circuit components;

positioning a retainer lid over said positioned circuit board and said receiving surface to provide a retained circuit assemblage;

inserting said retained circuit assemblage;

removing said supporting assembly back board and female mold to expose said production circuit board and inserted circuit components; and substantially simultaneously electrically coupling the surface mount leads of said inserted circuit components with corresponding abutting surface mount pads of said circuit boards.

11. The method of claim 10 wherein:

said male mold is provided having alignment pin mold components for establishing registration indicia with respect to said circuit board surface mount pad patterns;

said female mold is formed having registration indicia corresponding with said pin mold components; and including the step of providing alignment pins extending from said supportive assembly back board for extension through said female mold indicia and into said circuit board in registration relationship upon the positioning thereof upon said female mold over said inserted circuit components.

12. The method of claim 10 in which:

said female mold is formed of a transparent polymer; and including the step of positioning an assembly template identifying said circuit components upon said supportive assembly back board receiving surface beneath said female mold.

13. The method of claim 10 including the step of adhesively connecting said circuit board with said inserted circuit components by applying adhesive at select locations upons aid circuit board.

14. The method of claim 10 in which said coupling of said surface mount leads with said surface mount pads is by wave soldering.

15. The method of claim 10 including the step of depositing Re-Flow solder upon said surface mount pads of said circuit board prior to the positioning thereof over said inserted circuit components.

16. The method of claim 15 in which said coupling of said surface mount leads with said surface mount pads is by re-flow soldering technique.

* * * * *